United States Patent
Ben Artsi (10) Patent No.: US 8,922,246 B1
(45) Date of Patent: Dec. 30, 2014

(54) SYSTEM AND PROCESS FOR OVERCOMING WIRE-BOND ORIGINATED CROSS-TALK

(75) Inventor: Liav Ben Artsi, Qiriyat Yam (IL)

(73) Assignee: Marvell Israel (M.I.S.L) Ltd., Yokneam (IL)

(*) Notice: Subject to any disclaimer, the term of this patent is extended or adjusted under 35 U.S.C. 154(b) by 1233 days.

(21) Appl. No.: 12/255,809

(22) Filed: Oct. 22, 2008

Related U.S. Application Data (63) Continuation of application No. 11/129,392, filed on May 16, 2005, now Pat. No. 7,456,655.

(51) Int. Cl.
*H03K 19/0175* (2006.01)

(52) U.S. Cl.
USPC ............................................. 326/82; 326/86

(58) Field of Classification Search
CPC ............ G02B 6/12004; G02B 6/12019; H01S 5/0268; H01L 2924/3011; H04J 14/02
USPC ......................................... 326/30, 26, 82–87
See application file for complete search history.

(56) References Cited

U.S. PATENT DOCUMENTS

| | | |
|---|---|---|
| 4,113,996 A | 9/1978 | Sanderson |
| 4,605,980 A | 8/1986 | Hartranft et al. |
| 5,088,016 A | 2/1992 | Vinciarelli et al. |
| 5,181,092 A | 1/1993 | Atsumi |
| 5,428,837 A | 6/1995 | Bayrums et al. |
| 5,481,555 A | 1/1996 | Wade et al. |
| 5,546,038 A | 8/1996 | Croft |
| 5,646,543 A | 7/1997 | Rainal |
| 5,854,504 A | 12/1998 | Consiglio |
| 5,965,920 A | 10/1999 | Sung |
| 6,034,552 A | 3/2000 | Chang et al. |
| 6,061,222 A | 5/2000 | Morris et al. |
| 6,081,164 A | 6/2000 | Shigemori et al. |
| 6,107,684 A | 8/2000 | Busking et al. |
| 6,208,225 B1 | 3/2001 | Miller |
| 6,218,706 B1 | 4/2001 | Waggoner et al. |
| 6,232,645 B1 | 5/2001 | Belot |
| 6,317,305 B1 | 11/2001 | Dedic |
| 6,355,970 B1 | 3/2002 | Fujii |
| 6,387,775 B1 | 5/2002 | Jang et al. |
| 6,410,381 B2 | 6/2002 | Kim et al. |
| 6,559,493 B2 | 5/2003 | Lee et al. |

(Continued)

OTHER PUBLICATIONS

U.S. Appl. No. 10/397,402, filed Mar. 26, 2003; Inventor: Xiaodong Jin, Lawrence Tse, King Chun Tsai, George Chien and Shuran Wei.

(Continued)

*Primary Examiner* — Thienvu Tran (57) ABSTRACT

A system and process overcomes the influence of induced current and/or capacitance in wires and, more particularly, reduces and overcomes induced current and/or capacitance cross-talk between neighboring wire-bonds. A change or toggle in each of a plurality of outputs from a circuit is determined. The change determined for one selected output is compared with the change determined for neighboring outputs. When the change for the neighboring outputs is both the same as that of the selected output, the power of the output or the slew rate of an amplifier that receives the selected output is altered so that the output is increased. When the change for the neighboring outputs is both the opposite of that of the selected output, the power of the output or the slew rate of an amplifier that receives the selected output is altered so that the output is decreased.

28 Claims, 6 Drawing Sheets

(56) References Cited

U.S. PATENT DOCUMENTS

| | | |
|---|---|---|
| 6,580,286 B1 | 6/2003 | Tennen |
| 6,625,006 B1 | 9/2003 | Aram et al. |
| 6,713,836 B2 | 3/2004 | Liu et al. |
| 6,743,658 B2 | 6/2004 | Corisis |
| 6,756,664 B2 | 6/2004 | Yang |
| 6,757,967 B2 | 7/2004 | Jimarez et al. |
| 6,769,923 B2 | 8/2004 | Caldwell |
| 6,778,398 B2 | 8/2004 | Wyland |
| 6,781,242 B1 | 8/2004 | Fan et al. |
| 6,784,050 B1 | 8/2004 | Aram et al. |
| 6,790,710 B2 | 9/2004 | McLellan et al. |
| 6,791,429 B2 | 9/2004 | Mikalauskas |
| 6,794,702 B2 | 9/2004 | Park |
| 6,803,252 B2 | 10/2004 | Lao et al. |
| 6,813,486 B2 | 11/2004 | Sayers |
| 6,818,472 B1 | 11/2004 | Fan et al. |
| 6,825,572 B2 | 11/2004 | Tian et al. |
| 6,831,479 B2 | 12/2004 | Lo |
| 7,098,686 B2 | 8/2006 | Kong et al. |
| 2003/0183403 A1 | 10/2003 | Kluge et al. |
| 0200/3227296 | 12/2003 | Lee |
| 2003/0227296 A1* | 12/2003 | Lee ................................ 326/82 |
| 2004/0012457 A9 | 1/2004 | Soltan et al. |
| 2005/0050496 A1* | 3/2005 | Kovacs et al. .................... 716/6 |

OTHER PUBLICATIONS

U.S. Appl. No. 11/033,202, filed Jan. 11, 2005; Inventors: Xiaodong Jin, Lawrence Tse, King Chun Tsai, George Chien and Shuran Wei.

U.S. Appl. No. 11/034,093, filed Jan. 12, 2005; Inventors: Xiaodong Jin, Lawrence Tse, King Chun Tsai, George Chien and Shuran Wei.

U.S. Appl. No. 11/034,979, filed Jan. 13, 2005; Inventors: Xiaodong Jin, Lawrence Tse, King Chun Tsai, George Chien and Shuran Wei.

U.S. Appl. No. 11/125,490, filed May 9, 2005; Inventor: Liav Ben Artsi.

U.S. Appl. No. 10/397,454, filed Mar. 26, 2003; Inventors: Xiadong Jin, Lawrence Tse, King Chun Tsai, Sehat Sutaroja.

* cited by examiner

SYSTEM AND PROCESS FOR OVERCOMING WIRE-BOND ORIGINATED CROSS-TALK

CROSS-REFERENCE TO RELATED APPLICATIONS

This application is a Continuation of U.S. patent application Ser. No. 11/129,392, filed on May 16, 2005. The disclosure of the above application is incorporated herein by reference in its entirety.

FIELD OF INVENTION

The invention relates to a system and process for reducing parasitic characteristics outcome in electronic circuits and, more particularly, to a system and process for reducing and overcoming cross-talk between neighboring wires in integrated circuits' package.

BACKGROUND

Integrated circuits often comprise two or more circuits connected to each other. Wires, also referred to as bonds, are used to connect different integrated circuits. Bonds, which may be made of any conductive material, such as gold or copper, may be used, for example, to connect the die portion of an integrated circuit to a package substrate. Often, a number of these wires are located in close proximity to each other. This may be because the inputs and/or outputs for a circuit are located in close proximity to each other.

However, this proximity can cause cross-talk originated jitter or noise in the signals. More specifically, jitter can occur in a signal due to parasitic mutual inductance voltage noise caused by changes in the signal of neighboring bonds. For example, when the output of a signal changes (e.g., toggles from a high signal to a low signal), there is a resulting change in current in the bond. Further, this change in current causes, as a result of the parasitic mutual inductance, induced noise and/or jitter in neighboring bonds.

The parasitic mutual inductance may also cause noise, or jitter, in the signal at an output. Noise is a series of electric fluctuations and disturbances in the signal in a wire. Noise can cause errors in a circuit, as the components receiving the signal may incorrectly detect the signal. By way of example, where the signal is a high signal, a jitter in the signal may result in the circuit detecting a low signal. Thus, incorrect switching of devices in the integrated circuit may occur, leading to errors in the circuit and the output of the circuit. Further, more jitter in a signal causes a degradation of the valid signal timing and may damage timing parameters such as setup and hold, as well as damage to the eye pattern quality.

Therefore, a need exists for an integrated circuit that accounts for the parasitic mutual inductance and reduces or eliminates the effect of the parasitic mutual inductance or parasitic mutual capacitance in wires, bonds and/or package traces in an integrated circuit.

SUMMARY OF THE INVENTION

The invention avoids the disadvantages and drawbacks of the prior art and/or satisfies the need to eliminate or reduce the effects of the parasitic mutual inductance, or parasitic mutual capacitance in wires or bonds in an integrated circuit.

The invention thus provides a system and process for reducing and overcoming induced current cross-talk between wire bonds.

The invention may be implemented in a number of ways. According to one aspect of the invention, a circuit includes a plurality of signal lines and a plurality of drivers, which may be amplified, wherein each of the drivers is coupled to one of the signal lines and each of the drivers further includes a controller input. Each of the drivers may have an output connected to a respective bond pad. The circuit also includes a controller responsive to the controller input of each of the drivers for compensating for parasitic mutual inductance and/or parasitic mutual capacitance. The controller controls a selected driver based on a comparison of a change in a received signal at the selected driver and a change in a received signal of at least one of the other drivers. The controller may control a slew rate of the selected driver, and/or a drive strength of the selected driver, and the signal line of the selected driver and the signal line of the other driver may be adjacent. The at least one other driver may include a first other driver and a second other driver, and the signal line of the selected driver may be located between the signal line of the first other driver and the signal line of the second other driver. Further, the signal line of the selected driver may be adjacent to both the signal line of the first other driver and the signal line of the second other driver. The change in the received signal may be a toggle direction of the signal, and the comparison of the change in signal received at the selected driver and the change in signal received at the other driver may include comparing the toggle direction of the signal received at the selected driver with the toggle direction of the signal received at the other driver. The controller may increase the slew rate and/or the driver strength of the selected driver when the change in the toggle direction of the signal received at the selected driver is the same as the change in the toggle direction of the signal received at the other driver. The controller may decrease the slew rate and/or drive strength of the selected driver when the change in the toggle direction of the signal received at the selected driver is the opposite of the change in the toggle direction of the signal received at the other driver.

The controller may increase the slew rate and/or the drive strength of the selected driver when the change in the signal received at the selected driver is the same as the change in the signal received at the other driver. The controller may decrease the slew rate and/or drive strength of the selected driver when the change in signal received at the selected driver is the opposite of the change in the signal received at the other driver.

According to another aspect of the invention, a circuit is provided that includes a plurality of means for transmitting signals, where such means may include signal lines, and a plurality of means for driving signals, where such means may include a driver or amplifier, and where each of the means for driving is coupled to one of the signal transmitting means. The integrated circuit furthers include a means for controlling a selected one of the means for driving, where such means is a controller. This controlling may be based on a comparison of a change in a received signal at the selected means for driving and a change in a received signal of at least one other means for driving.

The means for controlling may control a slew rate and/or a drive strength of the selected means for driving, and the means for transmitting a signal of the selected means for driving and the means for transmitting a signal of the other means for driving may be adjacent. The at least one other means for driving may include a first other means for driving, such as a driver, and a second other means for driving, such as a driver, and the means for transmitting a signal of the selected means for driving may be located between the means for transmitting a signal of the first other means for driving and the means for transmitting a signal of the second other means for driving. The means for transmitting a signal of the selected means for driving may be adjacent to both the means for transmitting a signal of the first other means for driving and the means for transmitting a signal of the second other means for driving. The change in the signal may be a toggle direction of the signal, and the comparison of the change in signal received at the selected means for driving and the change in signal received at the other means for driving may include comparing the toggle direction of the signal received at the selected means for driving with the toggle direction of the signal received at the other means for driving. The means for controlling may increase a slew rate and/or a drive strength of the selected means for driving when the toggle direction of the signal received at the selected means for driving is the same as the toggle direction of the signal received at the other means for driving. The means for controlling may decrease a slew rate and/or a drive strength of the selected means for driving when the toggle direction of the signal received at the selected means for driving is the opposite of the toggle direction of the signal received at the other means for driving. The means for controlling may increase a slew rate and/or a drive strength of the selected means for driving when the change in the signal received at the selected means for driving is the same as the change in the signal received at the other means for driving. The means for controlling may decrease a slew rate and/or a drive strength of the selected means for driving when the change in signal received at the selected means for driving is the opposite of the change in the signal received at the other means for driving.

According to another aspect of the invention, a method of controlling a circuit, such as an integrated circuit, having a plurality of signal lines and drivers capable of controlling characteristics of a signal shape for each of the signal lines is provided. This method includes the steps of determining a change in signal in neighboring signal lines and controlling the driver characteristics such as driver strength or slew rate, to compensate for parasitic mutual inductance and/or parasitic mutual capacitance in at least one of the signal lines based on the change in signal in at least one other signal line.

The step of controlling the driver characteristics may include controlling a slew rate and/or a drive strength of the selected driver. The at least one signal line and the at least one other signal line may be adjacent. Further, the at least one other signal line may include a first neighboring signal line and a second neighboring signal line, and the at least one signal line may be located between the first neighboring signal line and the second neighboring signal line. In addition, the at least one signal line may be adjacent to both the first neighboring signal line and the second neighboring signal line. The change of the signal may be a toggle direction of the signal. Further, the method may include the step of comparing the toggle direction of the signal at the at least one of the signal lines with the toggle direction of the signal at the at least one neighboring signal line. The step of controlling the driver characteristics may include increasing a slew rate and/ or a drive strength of a driver when the toggle direction of the at least one signal is the same as the toggle direction of the signal received at the other driver. The step of controlling the driver characteristics may includes decreasing a slew rate and/or a drive strength of a driver when the toggle direction of the at least one signal is the opposite of the toggle direction of the signal received at the other driver. The step of controlling the driver characteristics may include increasing a slew rate and/or a drive strength of a driver when the toggling direction of the at least one signal is the same as the toggling direction of the signal received at the other driver. The step of controlling the driver characteristics may include decreasing a slew rate and/or a drive strength of a driver when the toggling direction of the at least one signal is the opposite of the toggling direction of the signal received at the other driver.

According to yet another aspect of the invention, a computer program containing code for causing a device to control a circuit, such as an integrated circuit having a plurality of signal lines and drivers capable of controlling characteristics of a signal for each of the signal lines is provided. The computer program may include code for determining a change in signal in neighboring signal lines and code for controlling the driver characteristics such as driver strength or slew rate to compensate for parasitic mutual inductance and/or parasitic mutual capacitance in at least one of the signal lines based on the change in signal in at least one other signal line. The at least one other signal line may include a first neighboring signal line and a neighboring signal line, and the at least one signal line may be located between the first neighboring signal line and the second neighboring signal line. Further, the at least one signal line may be adjacent to both the first neighboring signal line and the second neighboring signal line. The change of the signal may be a toggle direction of the signal. Further, the computer program may include code for comparing the toggle direction of the signal at the at least one of the signal lines with the toggle direction of the signal at the at least one other signal line. The code for controlling the driver characteristics may include increasing a slew rate and/or a drive strength of a driver when the toggle direction of the at least one signal is the same as the toggle direction of the signal received at the other driver. The code for controlling the driver characteristics may include decreasing a slew rate and/or a drive strength of a driver when the toggle direction of the at least one signal is the opposite of the toggle direction of the signal received at the other driver. The code for controlling the driver characteristics may include increasing a slew rate and/ or a drive strength of a driver when the change in the at least one signal is the same as the change in the signal received at the other driver. The code for controlling the driver characteristics may include decreasing a slew rate and/or a drive strength a driver when the change in the at least one signal is the opposite of the change in the signal received at the other driver.

BRIEF DESCRIPTION OF THE FIGURES

The accompanying drawings, which are included to provide a further understanding of the invention, are incorporated in and constitute a part of this specification, illustrate embodiments of the invention and together with the detailed description serve to explain the principles of the invention. In the drawings.

DETAILED DESCRIPTION OF THE INVENTION

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law.

A system and process are provided whereby parasitic mutual inductance and/or parasitic mutual capacitance is accounted for in wires, bonds or substrate trace routing of a circuit, such as an integrated circuit. Further, by accounting for the parasitic mutual inductance, noise or jitter in a signal may be reduced or eliminated. According to an embodiment of the invention, parasitic mutual inductance is accounted for by comparing the change in a signal in the wire of one selected output with the change in the signals in wires at one or more neighboring outputs. Based on this comparison, a driver such as an amplifier, for the selected output is controlled to reduce or eliminate noise caused by the parasitic mutual inductance. Controlling the driver may include increasing or decreasing the drive strength of the driver. In addition, controlling the driver may also include increasing or decreasing the slew rate of the driver.

According to various principles described herein, the invention changes the signal waveform at the output of a buffer in order to account for parasitic cross inductance or capacitance meaning to account for influence of neighboring signals. A goal of the invention is to account for jitter caused by parasitic cross inductance and/or parasitic mutual capacitance of neighboring wire bonds. The parasitic cross inductance and/or capacitance between adjacent wire bonds may cause different slew rate or edge timing on a signal (when looking at the far end of the wire bond) if it's neighboring wire bonds are toggling to the same direction as it does, in comparison to when the toggling direction is opposite, or if there is no toggling in the neighboring wire bonds. These three situations described above may result in three different rise times or three different edge timings.

The invention controls and changes the driver's output wave form according to the neighbors toggling direction. The invention controls the driver's strength or slew rate in a way that the timing of the signal (at the wire bond far end), after implementing the invention, will be less sensitive to neighbors induced cross inductance and/or capacitance jitter (delay). The change used is the amount and/or direction of the change applied to the driver strength or to the slew rate. The output buffer driving characteristics (strength or slew rate) are changed to account for jitter caused by parasitic cross characteristic, be it inductive or capacitive.

Figure 1:
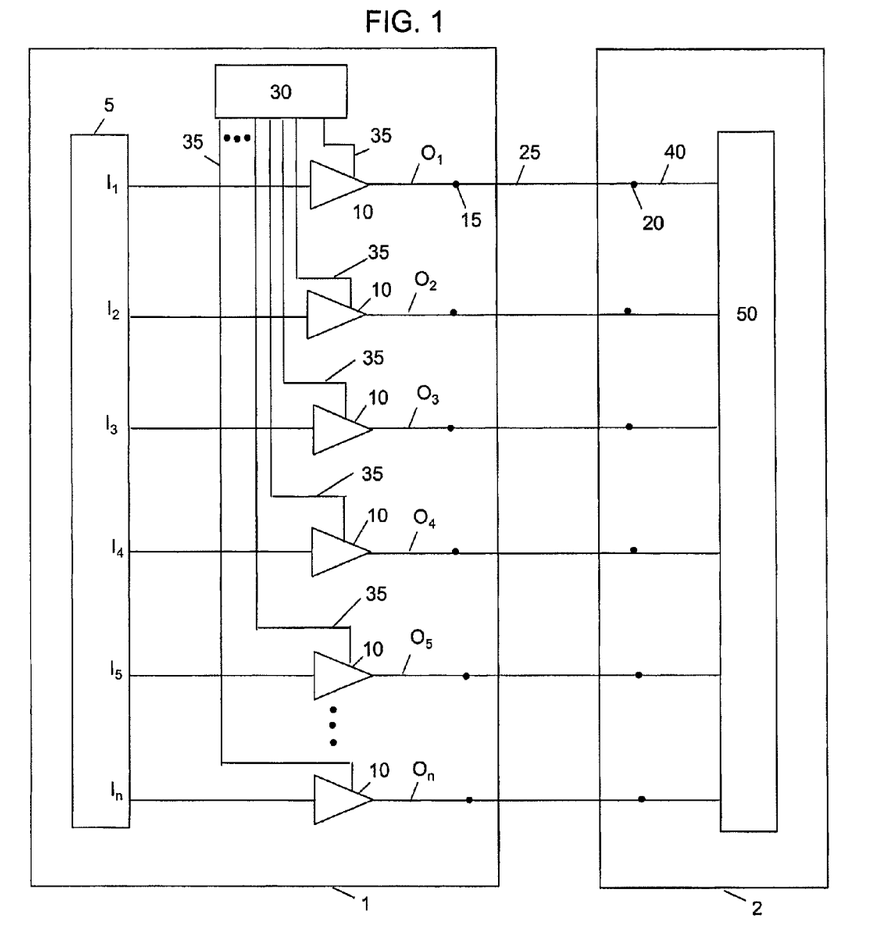
FIG. 1 is a schematic block diagram of an output section of an exemplary integrated circuit connected to another circuit according to the principals of the invention.
Figure 2:
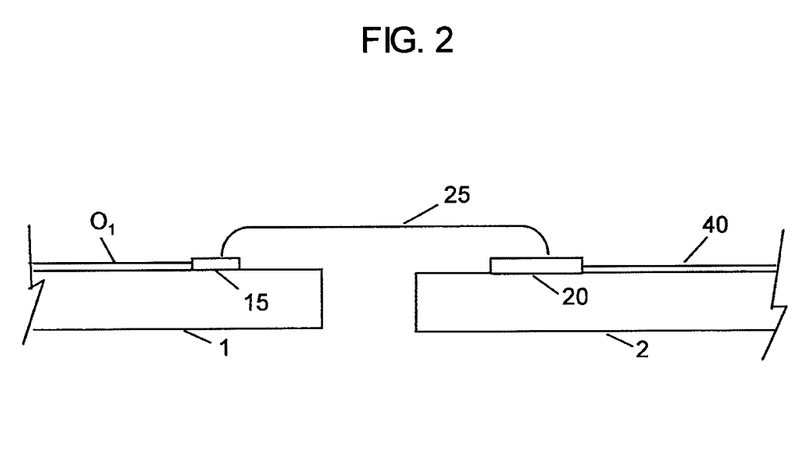
FIG. 2 is a side view of the exemplary integrated circuit of FIG. 1 showing the connection between the output section and the other circuit shown in FIG. 1.

FIG. 1 is a schematic block diagram of an output section of an exemplary integrated circuit structure 1 connected to another circuit structure 2 according to the principles of the invention. FIG. 2 shows the connection between the output section of the integrated circuit structure 1 and the other structure 2 circuit shown in FIG. 1. A plurality of inputs $I_1$ through $I_N$ are received by a plurality of drivers 10. As illustrated, each input $I_1$-$I_N$ has a respective driver 10. However, it is understood that other configurations may also be used. The inputs $I_1$ through $I_N$ are received from a core circuit 5. Core circuit 5 can be any type of circuit or circuits with a plurality of outputs. For example, core circuit 5 may be any general integrated circuit with a plurality of outputs. Alternatively, core circuit 5 may comprise a plurality of circuits, each with one output, that are then output in close proximity to one another. The principles of the invention may be implemented in other circuit configurations as the skill artisan will recognize. While the core circuit 5, the drivers 10, the controller 30 and the various lines are shown separately, it is understood that they may be combined in various configurations.

Driver 10 drives the signal received at the inputs $I_1$-$I_N$. Driver 10 may be an amplifier or any other type of driver which drives a received signal. Driver 10 may be any type of drive known to those of ordinary skill in the art.

Further, each driver 10 has an output $O_1$-$O_N$. The driver 10 drives the received signal to the respective output $O_1$-$O_N$. As illustrated, each output $O_1$-$O_N$ is connected to a respective output bond pad 15. An input bond pad 20 is located at the ends of input leads 40 of another circuit 50, such as a package substrate or another integrated circuit. A wire or bond 25 connects each of the output bond pads 15 to a respective input bond pad 20 at the ends of the input leads 40 of the other circuit 50. A wire or bond may be made of a conductive material, such as, for example, copper or gold.

As described in the Background of the Invention above, cross-talk, caused by parasitic mutual inductance and/or parasitic mutual capacitance, may occur between different wires, bonds or traces in a circuit. This may occur when the signals at one or more wires or bonds change. For example, as the clock (not shown) in the circuit 5 changes, the circuits provides signals at outputs $I_1$-$I_N$, where more, some or all of the outputs are changed, such as toggling from a high voltage level to a low voltage level or from a low voltage level to a high voltage level, and more, some or all of the outputs remain unchanged. In the exemplary embodiment illustrated in FIGS. 1 and 2, cross-talk as a result of parasitic mutual inductance and/or parasitic mutual capacitance may occur between one or more of the inputs $I_1$-$I_N$, between one or more of the outputs $O_1$-$O_N$, between one or more of the bonds, wires or package traces 25, and/or between one or more of the input leads 40 of the other circuit 50.

To account for the parasitic mutual inductance, and to reduce or eliminate the noise or jitter caused by the parasitic mutual inductance and/or parasitic mutual capacitance, a controller 30 is provided with controller leads 35 connected to each of the drivers 10. The controller 30 may be provided with various information about inputs $I_1$-$I_N$, including the current state of the input and the state of one, more, or all of the individual inputs $I_1$-$I_N$ on the next clock cycle. Controller 30 may then strengthen, weaken or leave unchanged the driver characteristics of the driver associated with a particular input $I_X$. Changing driver characteristics may include strengthening or weakening the drive strength and/or changing the slew rate or other characteristics known in the art. Controlling the drive strength may include changing the number of transistors (e.g. FETs) driving in parallel. According to an exemplary embodiment, the driver strength and/or slew rate of a driver for a selected input $I_X$ may be changed based on the information about the other inputs. For example, the drive strength and slew rate of a driver 10 for input $I_3$ may be controlled based on the information about inputs $I_2$ and $I_4$, as well as the other inputs. Controller 30 may be any type of controller known to one of the ordinary skill in the art. The controller 30 functions using standard programming instructions known to those of ordinary skill in the art. These instructions may be hardwired in the circuits of controller 30. Alternatively, the programming instructions may be in the form of software loaded into controller 30, such as from a processor to the controller 30.

According to one embodiment of the invention, a selected driver is controlled based on the signals and the change in signals in the neighboring drivers. By way of one example, the controller 30 controls the driver 10 associated with input $I_4$ by determining the change in the signal associated with inputs $I_3$, $I_4$ and $I_5$. In addition, it is understood that the change in other signals, such as the change in signals associated with inputs $I_2$ and $I_6$, may also cause cross-talk as a result of parasitic mutual inductance and/or parasitic mutual capacitance (although such effects may be smaller than in the case of directly neighboring inputs $I_3$ and $I_5$), and thus also may be used for controlling the driver associated with input $I_4$. However, for ease of explanation, and because the effects of parasitic mutual inductance and/or parasitic mutual capacitance decrease the further away one is from the signal of interest, the following illustration will be described with respect to inputs $I_3$, $I_4$, and $I_5$.

Controller 30 determines the change in signal, if any, that occurs in input $I_3$, the change in signal, if any, that occurs in input $I_4$ and the change in signal, if any, that occurs in input $I_5$. If the neighboring inputs $I_3$ and $I_5$ are changing in the same direction as that of the selected input $I_4$, the driver characteristics of the driver for input $I_4$ are strengthened to account for the parasitic mutual inductance between the path $I_4$ and the path of $I_3$ and/or $I_5$ including output $O_4$, output $O_5$ or associated wire bond 25 or input lead 40. Strengthening the driver characteristics may occur by increasing the drive strength or output of the driver 10, i.e., increasing the amount by which the received signal is amplified and/or by increasing the slew rate of the driver, i.e., decreasing the amount of time in which it takes the driver to fully amplify the received input signal.

Alternatively, if the neighboring inputs $I_3$ and $I_5$ are both changing in the same direction with each other but in an opposite direction as that of the selected input $I_4$, the driver characteristics of the driver for input $I_4$ are weakened to account for the parasitic mutual inductance between the wire bond $0_4$ and the neighboring wire bonds, such as those connected to $0_3$ and $0_5$. The mutual inductance occurs whether a toggle is present or not. In another embodiment, the driver characteristics of the driver for input $I_4$ may be weakened to account for parasitic mutual capacitance. Weakening the driver characteristics may occur by decreasing the drive strength or output of the driver 10, i.e., decreasing the amount by which the received signal is amplified and/or by decreasing the slew rate of the driver 10, i.e., increasing the amount of time in which it takes the driver to fully amplify the received input signal.

In an exemplary embodiment, if $I_3$ is changing in one direction and $I_5$ is changing in a different direction, the effects may cancel out, thereby requiring no change in the driver for $I_4$. Controller 30 may have information about the amount of cross inductance and/or capacitance between $I_3$ and $I_4$ and the paths they are connect to, including $O_3$ and $O_4$ and their wire bonds, and between $I_5$ and $I_4$ and the paths they are connect to, including $O_4$ and $O_5$ and their wire bonds, and therefore may decide to decrease or increase driver strength according to the output that has more coupling. A weighting factor may be applied in this determination.

If $I_3$ and $I_5$ are both changing in the same direction, but $I_4$ is not changing at all, a DC noise may occur. Driver characteristics may be changed, such as in the case of signals with a termination at the end of a trace.

By way of another exemplary embodiment, if $I_3$ and $I_5$ are changing in one direction, but $I_2$ and $I_6$ are changing in the opposite direction a weighting factor may be applied based on the distance between particular inputs, the distance between particular wire bonds and the mutual inductance/capacitance. As the influence of a signal is proportional to the distance between wires, bonds or package traces, greater weight may be given to directly neighboring wires, bonds or package traces than to those farther away. According to an exemplary embodiment, this weighting may be achieved through a lookup table having information on different situations. In the example above, where $I_3$ and $I_5$ change in one direction and $I_2$ and $I_6$ change in a different direction, the change of the driver characteristics for $I_4$ may be different than where $I_3$ and $I_5$ change in one direction and $I_2$ and $I_6$ stay the same.

Figure 3:
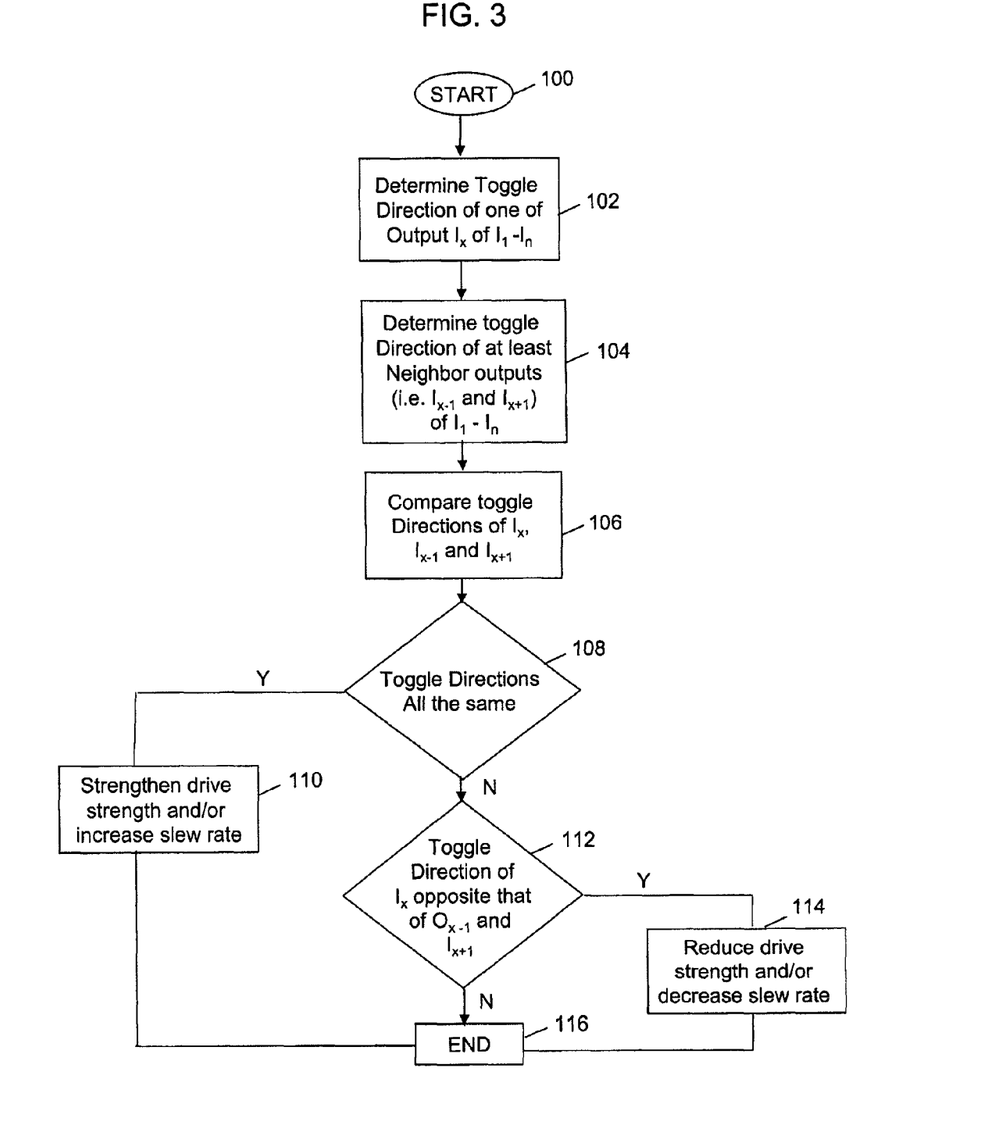
FIG. 3 is a flowchart illustrating an exemplary process for overcoming cross-talk according to the principles of the invention.

FIG. 3 is a flowchart illustrating an exemplary process for overcoming cross-talk according to the principles of the invention. This flowchart is described with reference to FIGS. 1 and 2. However, it is understood that concepts of the invention described in the flowchart are applicable to other circuit configurations, as will be understood by one of ordinary skill in the art.

The process starts at step 100. At step 102, the change in the signal for a selected input, e.g., $I_X$ of $I_1$ to $I_N$, is determined. At step 104 the change in signal for at least one of the neighboring inputs, e.g., $I_{X-1}$ and/or $I_{X+1}$, is determined. The determined change in signal for the inputs is compared at step 106. At step 108, a decision is made whether the changes in the signals for the inputs are all the same. If the changes in the signals are all the same, the drive characteristics of the driver for the selected input $I_X$ are strengthened at step 110. If the changes in the signal are not all the same, a decision is made whether the change in the signal of the selected input $I_X$ is different than the change in signal of the at least one neighboring input at step 112. If the change in signal of the selected input $I_X$ is the opposite of the change in signal of the at least one neighboring input, such as where the other neighboring input is not toggling, at least one drive characteristic of the driver for the selected input $I_X$ is weakened at step 112. The process ends at step 116. The process illustrated in the flowchart of FIG. 3 will now be described in greater detail below.

The process starts at step 100. At step 102, the change in the signal for a selected input, e.g., $I_X$ of $I_1$-$I_N$, is determined. As described above, determining the change in signal may include determining if the signal is changing from high to low, e.g., from a specified voltage level to a zero voltage level, or from low to high, e.g., from a zero voltage level to a specified voltage level. In addition, this step may include determining that there has been no change in the signal at the input $I_X$.

At step 104 the change in signal for at least one of the neighboring inputs, e.g., $I_{X-1}$ and/or $I_{X+1}$, is determined. As described above, the determining the change in signal may include determining if the signal is changing from high to low, e.g., from a specified voltage level to a zero voltage level, or from low to high, e.g., from a zero voltage level to a specified voltage level. In addition, this step may include determining that there has been no change in the signal. For purposes of this exemplary embodiment, the process will be described with neighboring inputs $I_{X-1}$ and $I_{X+1}$.

The determined change in signal for the inputs is compared at step 106. According to an exemplary embodiment of the invention, the change in the signal of the selected input $I_X$ is compared with the change in the signal in the neighboring inputs $I_{X-1}$ and $I_{X+1}$. Furthermore, the change in the signal of the neighboring input $I_{X-1}$ may be compared to the change in the signal of the neighboring input $I_{X+1}$. Alternatively, if the signal of only one neighboring input is detected, a comparison of the change in that neighboring signal is made with the change in the signal in the selected input $T_X$.

At step 108, a decision is made whether the changes in the signals for the outputs are all the same. According to an exemplary embodiment of the invention, a decision is made whether the change in the selected input $I_X$, the change in signal in the neighboring input $I_{X-1}$, and the change in the signal of the neighboring input $I_{X+1}$ are all the same. Alternatively, a decision may be made if the change in the neighboring signal is the same as the change in the signal in the selected input $I_X$. Other decisions, based on the number of neighboring inputs compared, may also be performed.

If the changes in the signals are all the same, at least one of the drive characteristics of the driver for the selected input $I_X$ is strengthened to account for parasitic mutual inductance at step 110. In another embodiment, at least one of the drive characteristics of the driver for the selected input $I_X$ is weakened to account for parasitic mutual capacitance. As described above, strengthening the drive characteristics may include increasing the drive strength, or output of the driver 10, i.e., increasing the amount by which the received signal is amplified, and/or increasing the slew rate of the driver 10, i.e., decreasing the amount of time in which it takes the driver to fully amplify the received input signal. Changes in drive characteristics may be based on additional parameters of the circuit. For example, changing the drive strength may change the overshoot and undershoot of the signal. Further, some circuits and interfaces may be governed by standards (e.g., peripheral component interface (PCI)) that limit characteristics such as drive strength and slew rate. Based on such additional factors, changing driver characteristics may include changing drive strength, changing the slew rate or changing both.

If the changes in the signal are not all the same, a decision is made whether the change in the signal of the selected input $I_X$ is different than the change in signal of the at least one neighboring input at step 112. According to an exemplary embodiment of the invention, a decision is made whether the change in the signal of the selected input $I_X$ is the opposite of the changes in the signals of both of the neighboring inputs $I_{X-1}$ and $I_{X+1}$. Alternatively, a decision may be made if the change in the neighboring signal is the opposite of the change in the signal in the selected input $I_X$. Other decisions based on the number of neighboring inputs compared may also be used.

If the change in signal of the selected input $I_X$ is the opposite of the change in the signal of the at least one neighboring output, at least one of the drive characteristics of the driver for the selected output $I_X$ is weakened at step 112. As described above, weakening the driver characteristics may include decreasing the drive strength or output of the driver 10, i.e., decreasing the amount by which the received signal is amplified, and/or decreasing the slew rate of the driver 10, i.e., increasing the amount of time in which it takes the driver to fully amplify the received input signal. The process ends at step 116. As described above, in case of mutual capacitance, the driver characteristics may be strengthen.

While the flowchart of FIG. 3 has been described in a particular order above, it will be understood by one of ordinary skill in the art that additional steps may be added, steps may be deleted, steps may be combined, and/or steps may be performed in a different order without departing from the invention. Further, based on characteristics of a particular signal and/or circuit used with the present invention, it may be desirable to have the process above performed in a particular order to achieve certain objectives. For example, if the process is implemented using a lookup table, it may be necessary to obtain information on the toggle directions of various signals and then access the lookup table to determine how to manipulate the various drivers.

Figure 4A:
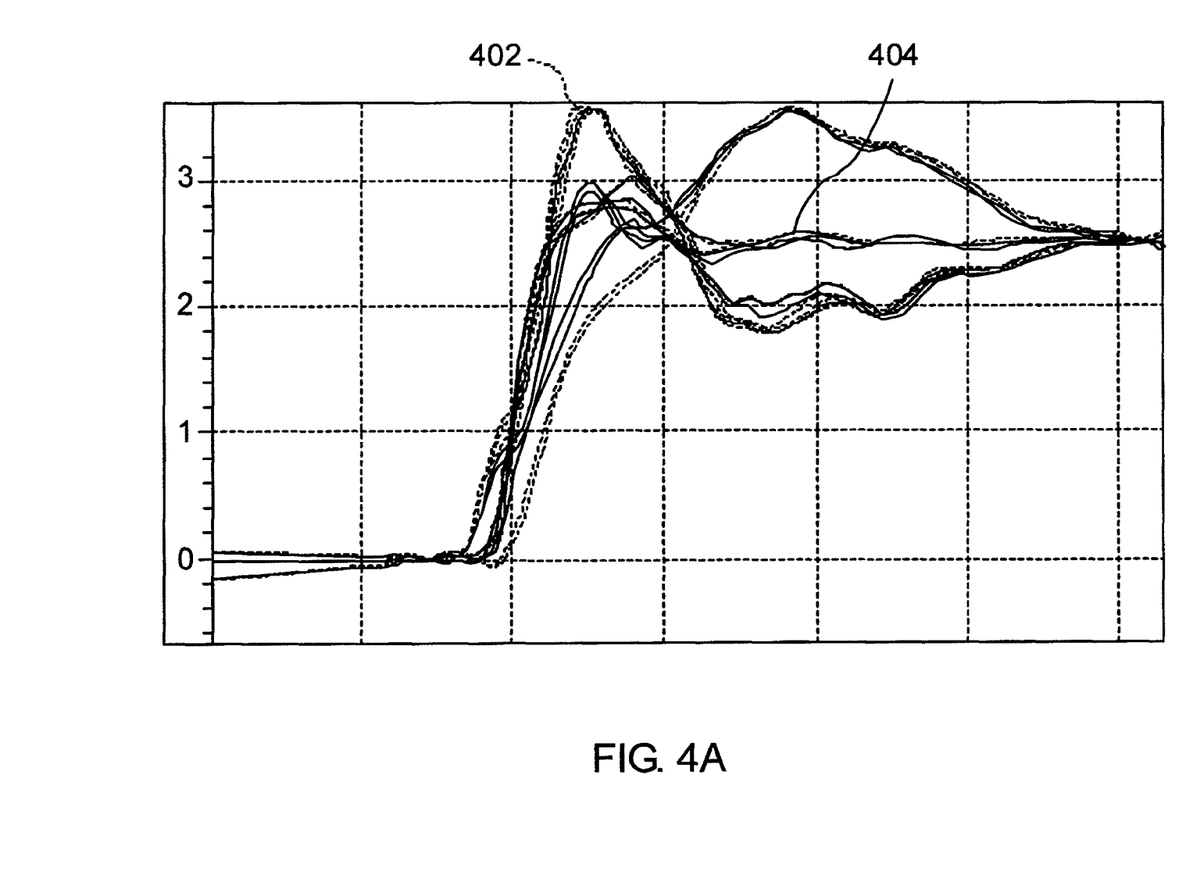
FIGS. 4A, 4B and 4C are graphic representations of waveforms based on simulations according to an exemplary embodiment of the invention.
Figure 4B:
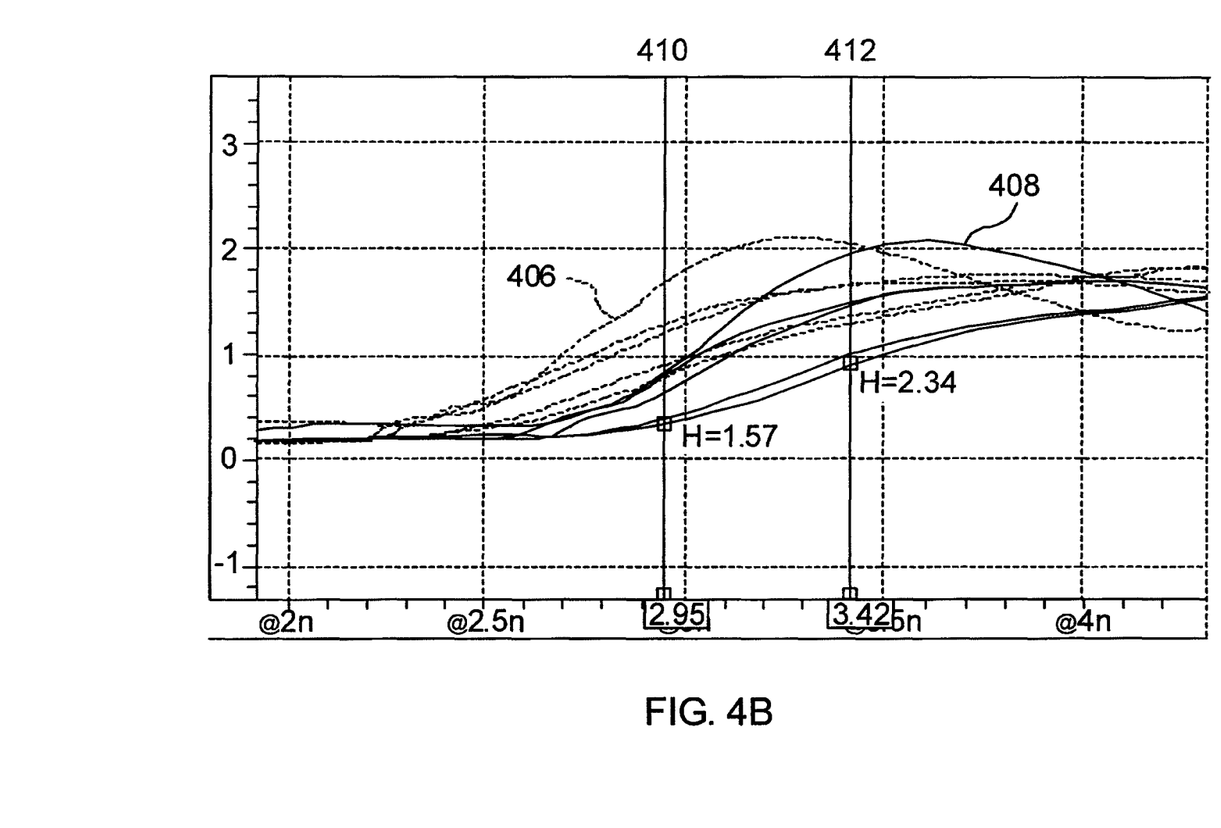
Figure 4C:
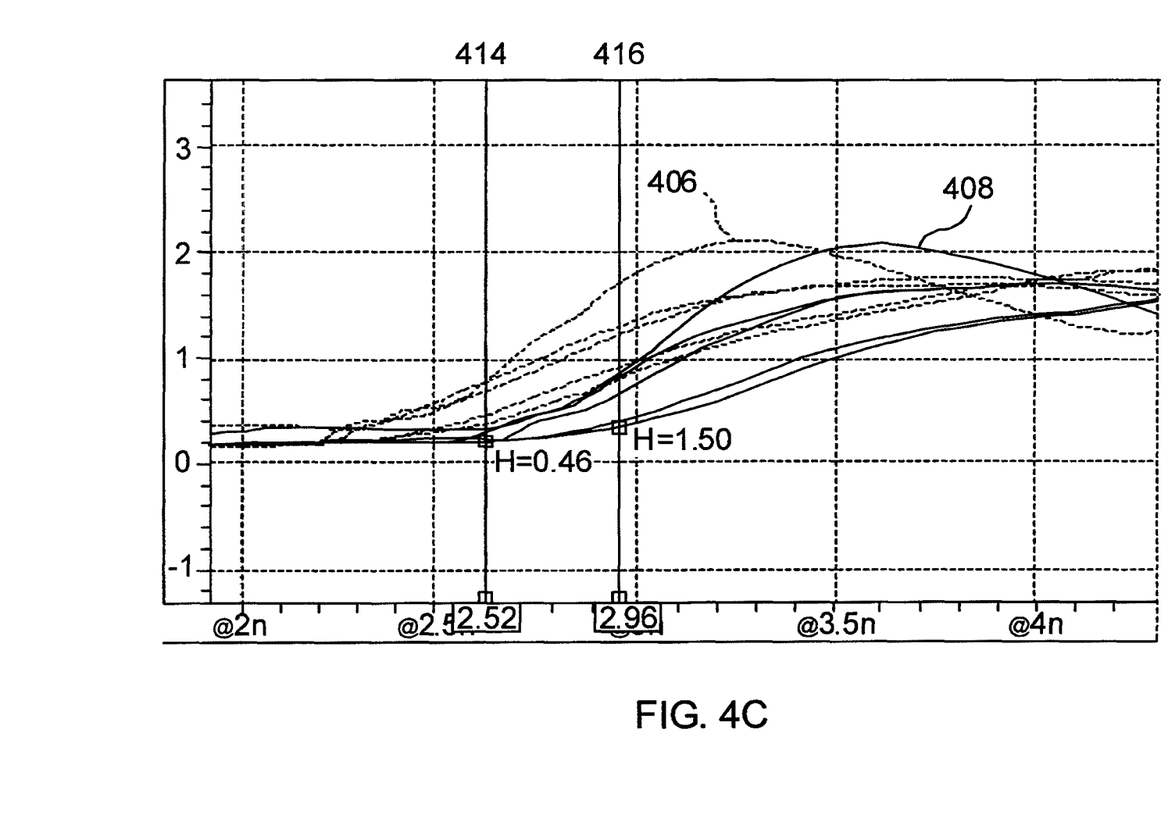

FIGS. 4A, 4B and 4C are graphic representations of waveforms based on simulations conducted according to the principles of the invention. These waveforms were obtained from simulations done on circuits where the measurements were performed at a device located at the far end of the transmission lines. FIG. 4A illustrates waveforms before and after the driver strength has been controlled, with the X-axis showing time in pico seconds, the Z-axis showing voltage, and the desired voltage moving from 0 to 2.5 volts. Red lines 402 are from a selected output $O_X$ before any change in the driver strength has been made, where the jitter along the axis is measured in pico seconds. As can be seen, the neighboring outputs $O_{X-1}$ and $O_{X+1}$ are causing cross-talk jitter due to mutual parasitic inductance.

Blue lines 404 are from the selected output $O_X$ when the driver strength has been controlled. In this example, the waveforms of blue lines 404 illustrate both driver strength being increased and driver strength being decreased (according to the specific direction $O_{X-1}$ and $O_{X+1}$ toggled). As can be seen, the jitter or noise caused by the parasitic mutual inductance has been reduced, thereby improving the reliability of the outputs of the drivers and reducing errors in the circuit, such as circuit 50 as shown in FIG. 1. Furthermore, the amount of overshoot has been decreased.

FIGS. 4B and 4C illustrate waveforms before and after the slew-rate has been controlled with the x-axis showing time in pico seconds and the Y-axis showing voltage. FIGS. 4B and 4C illustrate pink lines 406, which are a selected output $O_X$ before any change has been made to the slew-rate of the driver. As can be seen, this signal 406 has a time width, or time jitter of approximately 470 psec, as illustrated by an unadjusted first time mark 410 and an unadjusted second time mark 412 in FIG. 4B. The neighboring outputs $O_{X-1}$ and $O_{X+1}$ are causing cross-talk jitter due to mutual parasitic inductance.

FIGS. 4B and 4C also illustrate purple lines 408, which are the selected output $O_X$ when the slew-rate of the driver has been controlled. In this example, waveforms illustrate both an increase in the slew rate and a decrease in the slew rate. As can be seen, the jitter or noise time width caused by the parasitic mutual inductance has been reduced to approximately 340 psec, as shown by adjusted first time mark 414 and adjusted second time mark 416 in FIG. 4C, thereby improving the reliability of the outputs of the drivers and reducing errors in the circuit, such as circuit 50 as shown in FIG. 1.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed is:

1. A circuit comprising:
    a plurality of signal lines including a first signal line transferring a first signal and a second signal line transferring a second signal;
    a controller comprising a toggle direction comparator configured to compare toggle directions of the first and second signals; and
    said controller further configured to modify at least one of a slew rate and a drive strength of the first signal based on the respective toggle directions of the first and second signals.

2. The circuit of claim 1, wherein the controller is configured to increase at least one of the slew rate and the drive strength of the first signal when the toggle directions of the first and second signals are the same.

3. The circuit of claim 1, wherein the controller is configured to decrease at least one of the slew rate and the drive strength of the first signal when the toggle directions of the first and second signals are different.

4. The circuit of claim 1, wherein the first and second signal lines are adjacent to each other.

5. The circuit of claim 1, further comprising a plurality of bond pads connected to the plurality of signal lines, respectively.

6. The circuit of claim 1, wherein the plurality of signal lines further comprise a third signal line transferring a third signal, the first signal line being arranged between the second and third signal lines.

7. The circuit of claim 6, wherein the toggle direction comparator is configured to compare the toggle directions of the first and second signals and a toggle direction of the third signal.

8. The circuit of claim 7, wherein the controller is configured to modify at least one of the slew rate and the drive strength of the first signal based on the respective toggle directions of the first, second and third signals.

9. The circuit of claim 8, wherein the controller is configured to increase at least one of the slew rate and the drive strength of first signal when the toggle directions of the first, second and third signals are the same.

10. The circuit of claim 8, wherein the controller is configured to decrease at least one of the slew rate and the drive strength of the first signal when the toggle direction of the first signal is different from the toggle directions of the second and third signals.

11. The circuit of claim 8, wherein the first signal line is adjacent to the second and third signal lines.

12. An integrated circuit comprising the circuit of claim 1.

13. A method of reducing cross-talk in a plurality of signal lines comprising first and second signal lines, the method comprising:
comparing toggle directions of first and second signals transmitted via the first and second signal lines, respectively; and
modifying at least one of a slew rate and a drive strength of the first or the second signal based on the respective toggle directions of the first and second signals.

14. The method of claim 13, wherein the modifying at least one of the slew rate and the drive strength comprises increasing at least one of the slew rate and the drive strength of the first signal when the toggle directions of the first and second signals are the same.

15. The method of claim 13, wherein the modifying at least one of the slew rate and the drive strength comprises decreasing at least one of the slew rate and the drive strength of the first signal when the toggle directions of the first and second signals are different.

16. The method of claim 13, wherein the first and second signal lines are arranged adjacent to each other.

17. The method of claim 13, wherein the plurality of signal lines further comprise a third signal line transmitting a third signal, the first signal line being arranged between the second and third signal lines, and
the method further comprising:
comparing the toggle directions of the first and second signals and a toggle direction of the third signal; and
modifying at least one of the slew rate and the drive strength of the first signal based on the respective toggle directions of the first, second and third signals.

18. The method of claim 17, wherein the modifying at least one of the slew rate and the drive strength comprises increasing at least one of the slew rate and the drive strength of the first signal when the toggle directions of the first, second and third signals are the same.

19. The method of claim 17, wherein the modifying at least one of the slew rate and the drive strength comprises decreasing at least one of the slew rate and the drive strength of the first signal when the toggle direction of the first signal is different from the toggle directions of the second and third signals.

20. The method of claim 17, wherein the first signal line is adjacent to the second and third signal lines.

21. A non-transitory computer readable storage medium having a stored computer program embodying instructions, which, when executed by a computer, cause the computer to reduce cross-talk in a plurality of signal lines comprising first and second signal lines, the computer readable storage medium comprising:
instructions for comparing toggle directions of first and second signals transmitted via the first and second signal lines, respectively; and
instructions for modifying at least one of a slew rate and a drive strength of the first signal based on the respective toggle directions of the first and second signals.

22. The non-transitory computer readable storage medium of claim 21, wherein the instructions for modifying comprise instructions for increasing at least one of the slew rate and the drive strength of the first signal when the toggle directions of at least one of the first and second signals are the same.

23. The non-transitory computer readable storage medium of claim 21, wherein the instructions for modifying comprise instructions for decreasing at least one of the slew rate and the drive strength of the first signal when the toggle directions of the first and second signals are different.

24. The non-transitory computer readable storage medium of claim 21, wherein the first and second signal lines are arranged adjacent to each other.

25. The non-transitory computer readable storage medium of claim 21, wherein the plurality of signal lines further comprise a third signal line transmitting a third signal, the first signal line being arranged between the second and third signal lines, and
the computer readable storage medium further comprising:
instructions for comparing the toggle directions of the first and second signals and a toggle direction of the third signal; and
instructions for modifying at least one of the slew rate and drive strength of the first signal based on the respective toggle directions of the first, second and third signals.

26. The non-transitory computer readable storage medium of claim 25, wherein the instructions for modifying comprise instructions for increasing at least one of the slew rate and the drive strength of the first signal when the toggle directions of the first, second and third signals are the same.

27. The non-transitory computer readable storage medium of claim 25, wherein the instructions for modifying comprise instructions for decreasing at least one of the slew rate and the drive strength of the first signal when the toggle direction of the first signal is different from the toggle directions of the second and third signals.

28. The non-transitory computer readable storage medium of claim 25, wherein the first signal line is adjacent to the second and third signal lines.

\* \* \* \* \*